United States Patent [19]

Van Roessel

[11] 4,104,678

[45] Aug. 1, 1978

[54] VIDEO SWITCHING CIRCUIT

[75] Inventor: Frederik Johannes Van Roessel, Upper Saddle River, N.J.

[73] Assignee: North American Philips Corporation, New York, N.Y.

[21] Appl. No.: 798,320

[22] Filed: May 19, 1977

Related U.S. Application Data

[63] Continuation of Ser. No. 624,727, Oct. 22, 1975, abandoned.

[51] Int. Cl.² ............................................. H04N 9/52
[52] U.S. Cl. ..................................... 358/30; 358/160; 358/164; 358/181; 358/184
[58] Field of Search .................. 358/30, 32, 160, 164, 358/166, 181, 184; 330/51, 126, 124 R; 307/243

[56] References Cited

U.S. PATENT DOCUMENTS

| | | | |
|---|---|---|---|
| 3,522,449 | 8/1970 | McMurtrie | 307/243 |
| 3,702,898 | 11/1972 | Webb | 358/181 |

*Primary Examiner*—Richard Murray
*Attorney, Agent, or Firm*—Frank R. Trifari; Henry I. Steckler

[57] ABSTRACT

A circuit has two amplifiers each of which have different transfer functions. Means are shown for switching between them. The output signal can be a matrixed or non-matrixed color signal, or a gamma or non-gamma corrected signal. The amplifiers can be differential amplifiers.

7 Claims, 3 Drawing Figures

VIDEO SWITCHING CIRCUIT

This a continuation of application Ser. No. 624,727, filed Oct. 22, 1975, now abandoned.

The present invention relates to swtiching circuits, and more particularly to such circuits that can switch amplifiers in a television camera.

In television camera, it is desirable to be able to switch between two different versions of essentially the same signal, e.g. matrixed and non-matrixed, or gamma and non-gamma corrected. One method of doing this would be with a multipole switch, but this is cumbersome. Another method could use reed relays, but this requires a large amount of current and is expensive. In electronic switching circuits using field effect transistors having residual resistance, the gain is not accurate, and stray capacitance effects the video signal. Single bipolar transistors would have a high offset voltage.

It is therefore an object of the present invention to have a switching circuit that is compact.

It is a further object to have one that requires only a small amount of current.

It is yet another object to have one that has accurate gain, and does not undesirably effect the signal.

It is a still further object to have a circuit that has low offset and is D.C. coupled.

In brief, these and other objects are achieved by having two amplifiers with separate inputs and a common output. A switching means selectively switches one amplifier on and the other off by changing the bias thereon. Since no mechanical parts are located in the actual switching circuit, it is compact. Because relays are not switched, only a low current is drawn. A negative feedback loop stabilizes gain and reduces offset.

Other objects, features and advantages will become apparent from the following description when taken in conjunction with the drawings in which.

Figure 1:
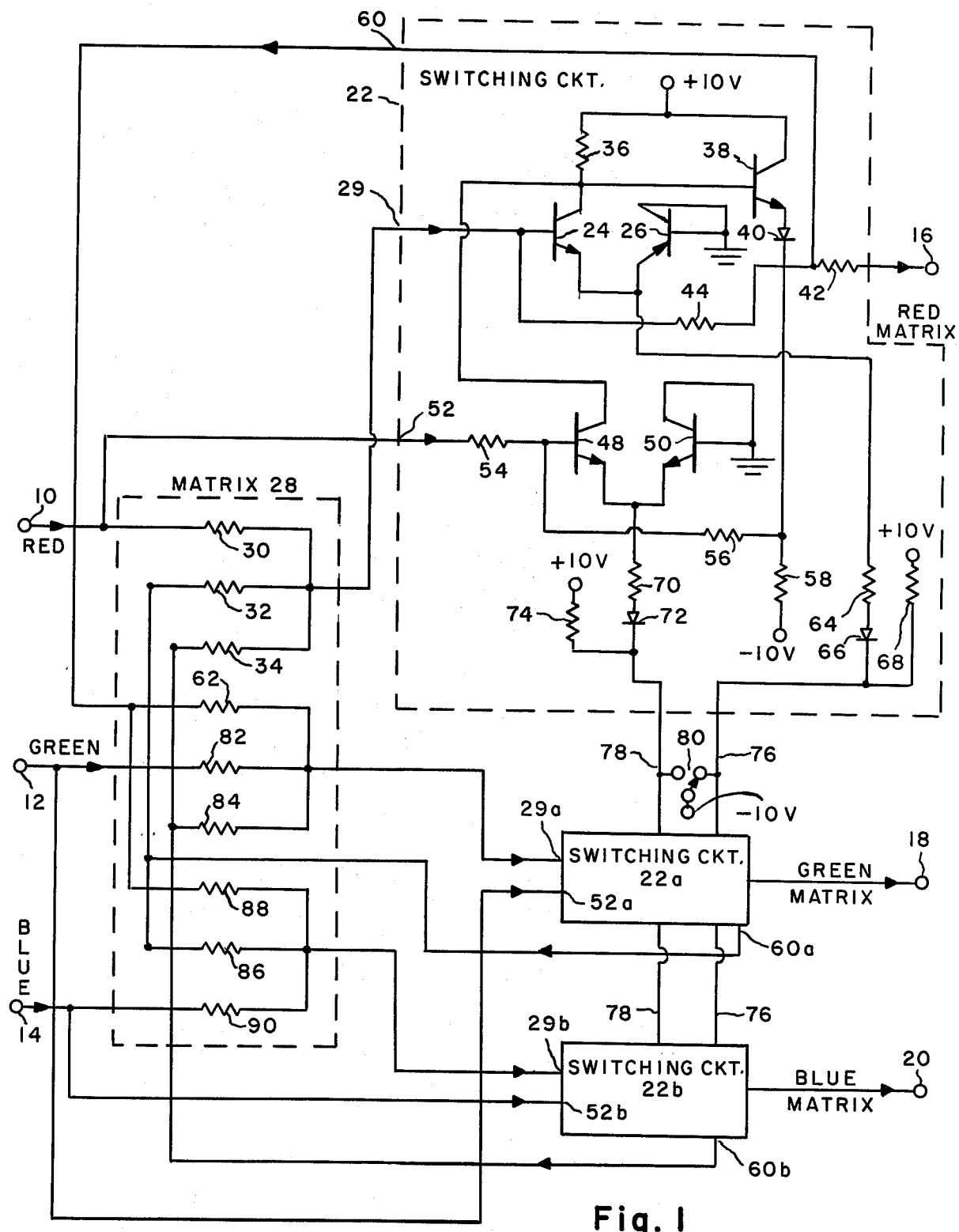
FIG. 1 is a schematic drawing of a first embodiment of the invention in a color matrix circuit.

In FIG. 1 there is shown a color matrix circuit, which has three inputs 10, 12, and 14 for receiving red, green, and blue pure color signals respectively. Three output terminals 16, 18 and 20 normally provide red, green, and blue matrixed output signals respectively. By "matrixed" is meant that while the named color predominates, some amount of the other two colors are also present. Sometimes it is desired to have the corresponding pure colors present at output terminals 16, 18 and 20. The identical switching circuits 22, 22a, and 22b enable this to happen.

The circuit 22 has two emitter coupled differential amplifiers. The first has two transistors 24 and 26. The base of transistor 24 receives the matrixed red signal from matrix 28 and matrix resistors 30, 32, and 34 at matrixed signal input 29. Although only nine resistors are shown in matrix 28, it is possible to have up to 15 resistors in it. Its collector has a collector load resistor 36 coupled to a voltage source of plus 10 volts. The transistor 26 has an emitter coupled to the emitter of transistor 24, and it has grounded base and collector electrodes. Emitter follower output transistor 38 has a base coupled to the collector of transistor 24, a collector coupled to receive the plus ten volts, and an emitter coupled to diode 40. Diode 40 shifts the level of the output signal at output 16 and allows it to go slightly negative, thus reducing distortion near the zero potential level. An impedance matching resistor 42 is coupled between diode 40 and output 16. A feedback resistor 44 is coupled between diode 40 and the base of transistor 24.

The second amplifier in switching circuit 22 comprises emitter coupled transistors 48 and 50. The base of transistor 48 receives the pure red signal from input 10, pure signal input 52, and resistor 54. The collector of transistor 48 is coupled to the base of emitter follower output transistor 38. A feedback resistor 56 is coupled from diode 40 to resistor 54, and the ratio between resistors 56 and 54 is typically chosen so that the gain of the second amplifier is about two. The collector and base of transistor 50 are grounded. Diodes could be used instead of transistors 50 and 26, but transistors provide a closer match of temperature varying characteristics to transistors 48 and 24 respectively. A resistor 58 is coupled at one end to resistor 56 and diode 40 and at the other end to a minus 10 volts source. A feedback output 60 is coupled from resistor 42 to matrix resistor 62.

A switching means is also present in circuit 22. It comprises a resistor 64, diode 66, and resistor 68 coupled to a plus 10 volts source, which without more would bias the diode 66, and hence cut off the emitter current of the transistors 24 and 26. The switching means further comprises a resistor 70, diode 72, and a resistor 74 coupled to a plus ten volts source, which similarly cuts off the emitter current of transistors 48 and 50. Further, it has lines 76 and 78 which continue through circuit 22a to circuit 22b, and it also comprises SPDT switch 80 coupled to lines 76 and 78 and a minus 10 volts source.

As stated before, circuits 22a and 22b are identical to circuit 22 except, of course, for their connection to matrix 28 and the signal inputs and outputs. Matrixed signal input 29a is coupled to matrix resistors 62, 82, and 84. Pure signal input 52a is coupled to green input 12. Feedback output 60a is coupled to matrix resistors 32 and 86. Matrixed signal input 29b is coupled to resistors 86, 88 and 90. Similarly, the pure signal input 52b and feedback output 60b are coupled to appropriate points in matrix 28.

In operation, pure red, green, and blue color signals are applied at inputs 10, 12, and 14, and thus to inputs 52, 52a and 52b. Matrix signal inputs 29, 29a and 29b received the matrixed signals from matrix 28. In the normal case, it is desired to have matrixed signals at outputs 16, 18 and 20. Therefore, the switch 80 is placed in the right hand position shown in FIG. 1. The minus 10 volts applied to line 76 overcomes the bias from the plus 10 volts source and resistor 68. Thus switching diode 66 and hence the emitters of transistors 24 and 26 are now forward biased. This enables the first amplifier and allows the red matrixed signal to appear at output 16. Since line 76 is also coupled to circuits 22a and 22b their corresponding first amplifiers will be enabled and the green matrixed signal will appear at output 18, and the blue matrixed signal at 20. If the pure signals are desired, such as when the camera is initially setup, then the switch 80 is placed in the left hand position, diode 72 becomes forward biased, and transistors 48 and 50 are enabled in all circuits 22, 22a, and 22b, while transistors 24 and 26 are disabled, and the corresponding pure signals are at outputs 16, 18 and 20. The high input impedance of that particular amplifier that is off prevents it from loading the circuit, while the low output impedance of the emitter followers 38 and that of the sources coupled to inputs 10, 12, and 14 shunt any current from the matrix 28 or the feedback resistors 44 or 56, which are still connected when pure signals are at outputs 16, 18 and 20.

Figure 2:
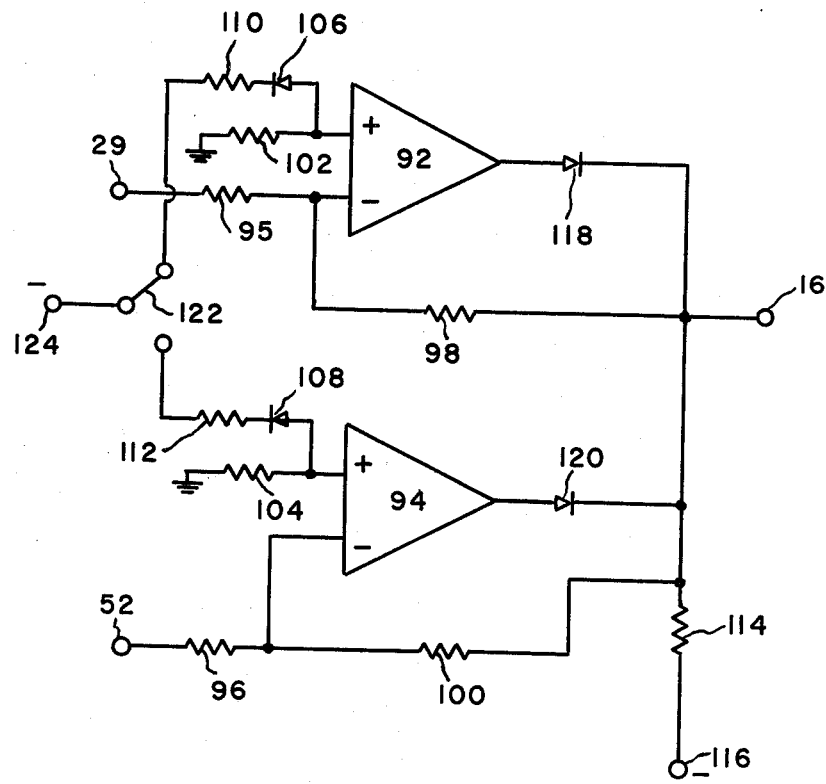
FIG. 2 is a drawing of an alternative embodiment of a portion of FIG. 1.

FIG. 2 shows an alternate embodiment for the circuits 22, 22a and 22b, where corresponding parts have been given corresponding reference numbers. It features two operational amplifiers 92 and 94 having input resistors 95 and 96, feedback resistors 98 and 100, offset output voltage compensating resistors 102 and 104, normally reversed biased switching diodes 106 and 108, resistors 110 and 112, and output load resistor 114 which receives a negative supply voltage from terminal 116. Diodes 118 and 120 ensure that the output of the amplifier which is negative is not connected to terminal 116. Switch 122 applies a negative forward bias voltage from terminal 124 to either of diodes 106 or 108, and thus selects which of normally on amplifiers 92 and 94 is disabled. This determines whether the matrixed signal at input 29 or the pure signal at terminal 52 is applied to output 16. Of course, part of the signal at terminal 16 is applied to the matrix 28 as is the case in FIG. 1 by a feedback network (not shown).

Figure 3:
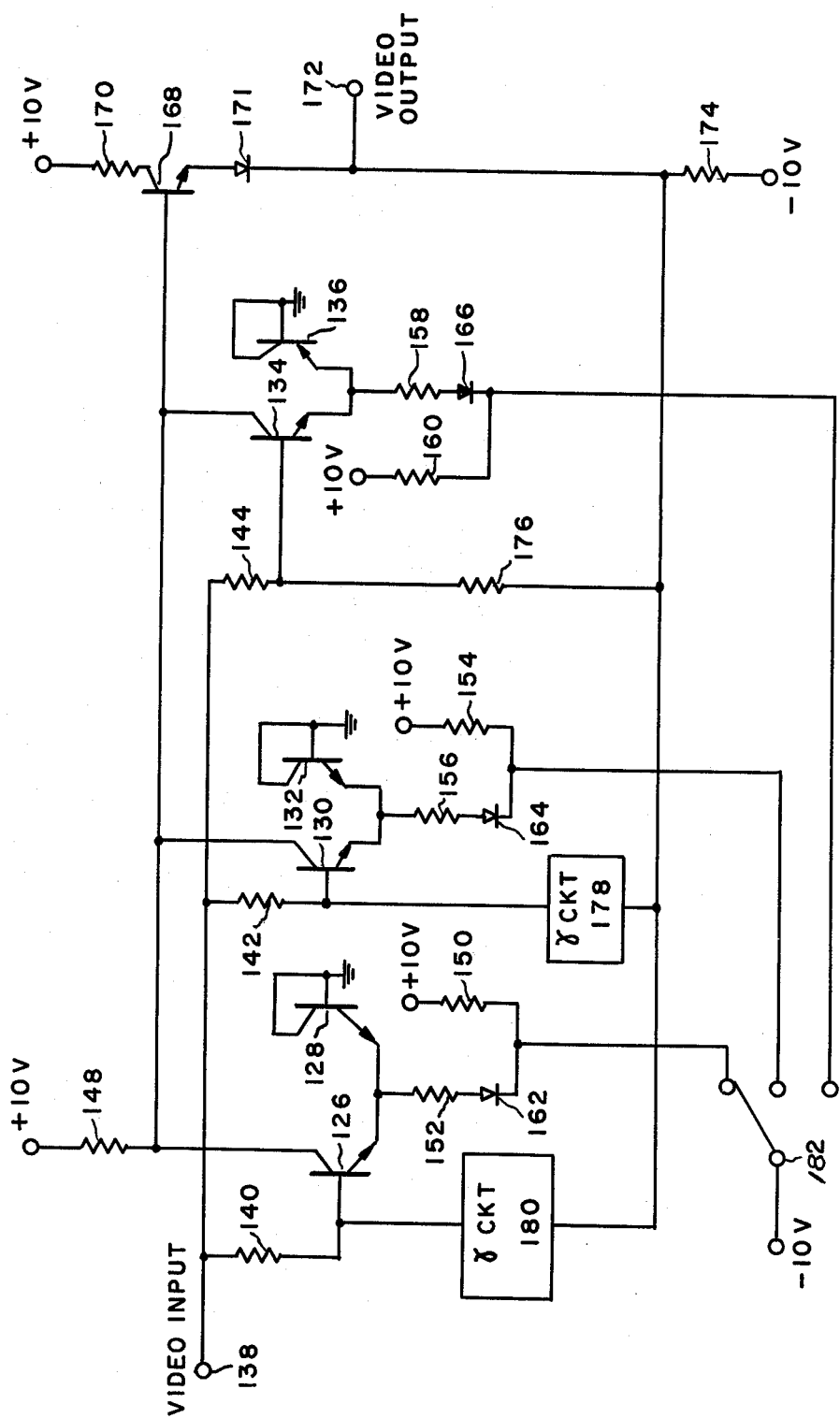
FIG. 3 shows a second application to a gamma correction circuit.

FIG. 3 shows another application of the switching principle of the invention to gamma correction circuit. It will be readily seen that it has three differential amplifiers respectively comprising transistors 126, 128; 130, 132; and 134, 136. The video signal is received at input terminal 138 and applied through resistors 140, 142, and 144 to the bases of transistors 126, 130, and 134 respectively. The collectors of said transistors are coupled to a source of plus 10 volts through resistor 148. As before, bias networks having resistors 150, 152; 154, 156; and 158, 160 and diodes 162, 164, and 166 are coupled to a source of plus 10 volts that keep all the diodes reversed biased and thus cut off the current in all transistors coupled thereto. The collectors of transistors 126, 130 and 134 are coupled to the base of emitter follower transistor 168. The collector receives a plus 10 volts through resistor 170. A level shifting diode 171 is coupled to video output terminal 172 and to a source of minus 10 volts through resistor 174. A feedback resistor 176 couples the output signal to the base of transistor 134. Also present are gamma correction circuits 178 and 180 that couple the output signal back to the bases of transistors 130 and 126 respectively. These circuits can be conventional gamma correction circuits using diodes to achieve a piecewise linear approximation to the appropriate gamma function, and they are therefore not further shown in detail. Two are shown since it is desirable to have two different gamma functions for high and low contrast scenes, such as for indoors and outdoors. Switch 182 receives minus 10 volts at its center terminal and selectively applies it to one of the diodes 162, 164, or 166, thus forward biasing it. Therefore, the operator can chose which gamma corection function he desires, or none at all, i.e. a linear transfer function, if transistors 134 and 136 are switched on. The video signal will be applied from the collector of one of the transistors 126, 130 or 134 to emitter follower 168 and then to output terminal 172. Of course, if a color camera is involved, three of the circuits of FIG. 3 will be required, one for each of the red, green, and blue channels.

It will be appreciated that many other embodiments of the invention are possible without departing from the spirit and scope of the invention.

I claim:

1. A circuit comprising two differential amplifiers, each of said amplifiers having inverting input means for receiving respective input signals, a common emitter lead pair, and a common low impedance output, each pair of said emitter leads including a diode, each amplifier further comprising a feedback network coupled to said common output and to said respective input means, and means coupled to said amplifiers for selecting which of said input signals is amplified and applied to said common output including switchable means for biasing one of said diodes on and the other diode off.

2. A circuit as claimed in claim 1 wherein said common output comprises an emitter follower stage.

3. A circuit comprising amplifiers,
a plurality of switching circuits each comprising two amplifiers, each of said amplifiers having inverting input means for receiving respective input signals and a common low impedance output, each amplifier further comprising a feedback network coupled to said common output and to said respective input means;
means coupled to said amplifiers for selecting which of said input signals is amplified and applied to said common output including switchable means for biasing one of said amplifiers on and the other amplifier off;
a plurality of main input means respectively coupled to one of said input means of each switching circuit;
and a main feedback network having a first plurality of inputs respectively coupled to said main input means, a second plurality of inputs respectively coupled to said common outputs, and a plurality of outputs respectively coupled to the remaining input means of each switching circuit.

4. A plurality of circuits as claimed in claim 3 wherein each of said pluralities numbers three, said main input means respectively receive red, blue, and green video signals, said main feedback network comprises a color matrix, and said common outputs respectively supply either matrixed or pure, red, blue, and green color signals in accordance with said selecting means.

5. A circuit comprising two amplifiers, each of said amplifiers having inverting input means for receiving respective input signals and a common low impedance output, each amplifier further comprising a feedback network coupled to said common output and to said respective input means, means coupled to said amplifiers for selecting which of said input signals is amplified and applied to said common output including switchable means for biasing one of said amplifiers on and the other amplifier off, wherein the improvement comprises said input means being coupled together to receive a common input signal, and one of said feedback networks comprises a first non-linear feedback network coupled between said common output and the input means of one of said amplifiers.

6. A circuit as claimed in claim 5 wherein said feedback network comprises a first gamma correction network for a video signal, and said selecting means selects between gamma corrected and non-gamma corrected output signals.

7. A circuit as claimed in claim 6 further comprising a third amplifier having an input coupled to said other amplifier inputs and an output coupled to said common output with said other amplifiers, a second gamma correction network different from said first one coupled between said output and said third amplifier, and said selecting means selects among two different gamma corrected signals and a non-gamma corrected one.

* * * * *